US012710850B2

(12) United States Patent
Ma

(10) Patent No.: US 12,710,850 B2
(45) Date of Patent: Aug. 18, 2026

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Liang Ma, Wuhan (CN)

( * ) Notice: Subject to any disclaimer, the term of this patent is extended or adjusted under 35 U.S.C. 154(b) by 341 days.

(21) Appl. No.: 17/622,833

(22) PCT Filed: Dec. 22, 2021

(86) PCT No.: PCT/CN2021/140615

§ 371 (c)(1),
(2) Date: Oct. 14, 2024

(87) PCT Pub. No.: WO2023/108773

PCT Pub. Date: Jun. 22, 2023

(65) Prior Publication Data

US 2025/0156015 A1 May 15, 2025

(30) Foreign Application Priority Data

Dec. 17, 2021 (CN) ......................... 202111550086.1

(51) Int. Cl.

*G06F 3/044* (2006.01)
*G06F 3/041* (2006.01)
*H10K 59/40* (2023.01)

(52) U.S. Cl.

CPC ........ *G06F 3/0446* (2019.05); *G06F 3/04164* (2019.05); *G06F 3/0443* (2019.05); *H10K 59/40* (2023.02)

(58) Field of Classification Search

None
See application file for complete search history.

(56) References Cited

U.S. PATENT DOCUMENTS

2010/0245308 A1* 9/2010 Takei ...................... G06F 3/045 345/206
2012/0169580 A1 7/2012 Nishi et al.
(Continued)

FOREIGN PATENT DOCUMENTS

CN 101872587 A 10/2010
CN 104777955 A 7/2015
(Continued)

OTHER PUBLICATIONS

Chinese Office Action issued in corresponding Chinese Patent Application No. 202111550086.1 dated Apr. 21, 2023, pp. 1-10.
(Continued)

*Primary Examiner* — Christopher R Lamb

(57) ABSTRACT

A display panel is provided. A touch layer includes touch electrodes arranged along a first direction and a second direction. A demultiplexing circuit group includes a demultiplexing circuit corresponding to each touch electrode. The multiple demultiplexing circuits in the demultiplexing circuit group are arranged along the first direction and the second direction according to the multiple touch electrodes. Thereby, a length of the demultiplexing circuit in the second direction can be reduced, which helps increase a length of an L-cut formed in a driving bonding area.

10 Claims, 3 Drawing Sheets

(56) References Cited

U.S. PATENT DOCUMENTS

| | | | | |
|---|---|---|---|---|
| 2015/0382446 | A1 | 12/2015 | Kwon et al. | |
| 2017/0228084 | A1 * | 8/2017 | Kim | G06F 3/04164 |
| 2019/0189075 | A1 | 6/2019 | Kim | |
| 2021/0181888 | A1 * | 6/2021 | Yan | G06F 3/0445 |

FOREIGN PATENT DOCUMENTS

| | | | |
|---|---|---|---|
| CN | 106066738 | A | 11/2016 |
| CN | 106292025 | A | 1/2017 |
| CN | 106681077 | A | 5/2017 |
| CN | 107039467 | A | 8/2017 |
| CN | 107342050 | A | 11/2017 |
| CN | 107562279 | A | 1/2018 |
| CN | 107704145 | A | 2/2018 |
| CN | 109494229 | A | 3/2019 |
| CN | 109634466 | A | 4/2019 |
| CN | 109901746 | A | 6/2019 |
| CN | 110199248 | A | 9/2019 |
| CN | 110531882 | A | 12/2019 |
| CN | 110648641 | A | 1/2020 |
| CN | 110688030 | A | 1/2020 |
| CN | 110764653 | A | 2/2020 |
| CN | 112436047 | A | 3/2021 |
| CN | 112835474 | A | 5/2021 |
| CN | 113064513 | A | 7/2021 |
| CN | 113485587 | A | 10/2021 |
| JP | 2003066868 | A | 3/2003 |

OTHER PUBLICATIONS

International Search Report in International application No. PCT/CN2021/140615,mailed on Aug. 29, 2022.

Written Opinion of the International Search Authority in International application No. PCT/CN2021/140615, mailed on Aug. 29, 2022.

* cited by examiner

DISPLAY PANEL

TECHNICAL FIELD

The present application relates to the field of display technologies, and more particularly to a display panel.

BACKGROUND

Organic light emitting display panels (OLEDs) have been widely used in life. In a flexible organic light emitting display panel, as shown in FIG. 1, FIG. 1 is a schematic diagram of a display panel in the prior art. A display panel 10 includes a non-display area AB and a display area AA surrounded by the non-display area AB. The non-display area AB on at least one side of the display area AA is a driving bonding area ABC. In this part, this area is installed or electrically connected to a driving chip, a chip on film (COF), and etc. A bending part ABC1 of the driving bonding area ABC is bent to a back side of the display panel 10. In order to facilitate the bending of the bending part ABC1 and reduce a space of a whole machine, it is necessary to arc cut two ends of the bending part ABC1 along a second direction x. This makes a driving bonding area ABC form an L-cut. The existing display panel 10 includes a touch layer. The touch layer includes touch electrodes arranged in the display area and arranged along a first direction y and the second direction x and touch wires arranged corresponding to the touch electrodes. The first direction y is different from the second direction x. A demultiplexing circuit group 30 is arranged in the driving bonding area ABC. The demultiplexing circuit group 30 includes a demultiplexing circuit corresponding to each touch electrode. Each demultiplexing circuit is electrically connected to the corresponding touch electrode through a touch wire.

However, a length of the demultiplexing circuit group in the second direction x in the prior art is very large, resulting in a small length d in the second direction x of the L-cut formed by the driving bonding area ABC. Therefore, an arrangement of the multiplexing circuit group in the prior art limits the length d of the L-cut formed in the driving bonding area ABC in the second direction x. This is not conducive to the bending of the driving bonding area ABC and is not conducive to a reduction of an overall size and an improvement of its portability.

SUMMARY

Technical Problem

The embodiment of the present application provides a display panel, which can solve the technical problems that the length of the demultiplexing circuit group in the prior art is too large, resulting in a small length of the L-cut formed in the driving bonding area ABC, which is not conducive to the bending of the driving bonding area ABC, and is not conducive to the reduction of the overall size and the improvement of its portability.

Solutions to the Technical Problem

Technical Solutions

An embodiment of the present application provides a display panel including a display area and a non-display area located on a side of the display area, wherein the display panel includes:

a substrate;

a touch layer disposed on a side of the substrate, wherein the touch layer comprises touch electrodes arranged in the display area and arranged along the first direction and the second direction and touch wires disposed corresponding to the touch electrodes, and the first direction is different from the second direction;

a demultiplexing circuit group disposed on a side of the substrate and located in the non-display area, wherein the demultiplexing circuit group comprises demultiplexing circuits corresponding to the touch electrodes, and each of the demultiplexing circuits is electrically connected to a corresponding touch electrode through the touch wires;

wherein the demultiplexing circuits are arranged along the first direction and the second direction in the non-display area, and in the first direction, the demultiplexing circuits corresponding to the touch electrodes in a same column are arranged in a same column.

Optionally, in some embodiments of the present application, the display panel further comprises a plurality of non-display touch bonding terminals, and each of the touch bonding terminals is electrically connected to an input terminal of the demultiplexing circuits that multiplex a same signal channel.

Optionally, in some embodiments of the present application, the demultiplexing circuit comprises a plurality of first transistors, and the plurality of first transistors in each demultiplexing circuit are arranged along the first direction.

Optionally, in some embodiments of the present application, the display panel further comprises:

a driving circuit layer disposed between the substrate and the touch layer, wherein the driving circuit layer comprises a plurality of driving circuits arranged along the first direction and the second direction, and the driving circuit comprises a second transistor;

wherein a channel extension direction of the second transistor is different from a channel extension direction of the first transistor.

Optionally, in some embodiments of the present application, a channel of the first transistor extends along the first direction.

Optionally, in some embodiments of the present application, a channel of the second transistor extends along the second direction.

Optionally, in some embodiments of the present application, the plurality of first transistors of each demultiplexing circuit at least comprise a first driving transistor, a first sensing transistor, and a first reset transistor, the first driving transistor, the first sensing transistor, and the first reset transistor are arranged along the first direction;

the demultiplexing circuit group further comprises a plurality of driving wires, the plurality of driving wires comprise at least one driving signal providing wire, a plurality of sensing signal receiving wires, and at least one reset signal providing wire, the driving signal providing wire is electrically connected to a corresponding touch electrode through a corresponding first driving transistor, the sensing signal receiving wire is electrically connected to the corresponding touch electrode through a corresponding first sensing transistor, and the reset signal providing wire is electrically connected to a corresponding touch electrode through a corresponding first reset transistor.

Optionally, in some embodiments of the present application, the plurality of touch electrodes comprise a plurality of touch electrode columns arranged along the first direction and a plurality of touch electrode rows arranged along the second direction, the touch layer comprises at least a first touch layer group and a second touch layer group, the first touch layer group and the second touch layer group both comprise at least two columns of touch electrode columns;

wherein the touch electrodes of each row in the first touch layer group are electrically connected to the same sensing signal receiving wire through the demultiplexing circuits of a corresponding row, the touch electrodes in each column of the first touch layer group are electrically connected to different sensing signal receiving wires through the demultiplexing circuits of a corresponding column;

wherein the touch electrodes of each row in the second touch layer group are electrically connected to the same sensing signal receiving wire through the demultiplexing circuits of a corresponding row, the touch electrodes in each column of the second touch layer group are electrically connected to different sensing signal receiving wires through the demultiplexing circuits of a corresponding column, and the sensing signal receiving wire electrically connected to the first touch layer group is different from the sensing signal receiving wire electrically connected to the second touch layer group.

Optionally, in some embodiments of the present application, a plurality of the touch electrodes in the first touch layer group are electrically connected to the same driving signal providing wire through the demultiplexing circuits in a corresponding rows;

the plurality of touch electrodes in the second touch control layer group are electrically connected to the same driving signal providing wire through the demultiplexing circuits in a corresponding row.

Optionally, in some embodiments of the present application, the plurality of the touch electrodes in the first touch layer group are electrically connected to the same reset signal providing wire through the demultiplexing circuits in a corresponding row;

the plurality of touch electrodes in the second touch layer group are electrically connected to the same reset signal providing wire through the demultiplexing circuits in a corresponding row.

Optionally, in some embodiments of the present application, the first touch layer group and the second touch layer group are electrically connected to the same driving signal providing wire and the same reset signal providing wire.

Optionally, in some embodiments of the present application, when the display panel performs a touch operation, the first sensing transistors corresponding to the touch electrodes of a column of the touch electrode columns in the first touch layer group and the first sensing transistors corresponding to the touch electrodes of a column of the touch electrode columns in the second touch layer group are turned on at the same time.

Advantageous Effects of the Present Disclosure

Advantageous Effects

In the embodiment of the present application, a display panel is provided. The touch layer includes touch electrodes arranged in the display area and arranged along the first direction and the second direction and touch wires arranged corresponding to the touch electrodes. The first direction is different from the second direction. The demultiplexing circuit group includes a demultiplexing circuit corresponding to each touch electrode. Each demultiplexing circuit is electrically connected to the corresponding touch electrode through a touch wire. A plurality of demultiplexing circuits are arranged along the first direction and the second direction in the non-display area. In the first direction, the demultiplexing circuits corresponding to the same column of touch electrodes are arranged in the same column. The multiple demultiplexing circuits in the demultiplexing circuit group are arranged along the first direction and the second direction according to the multiple touch electrodes in the non-display area. Therefore, the length of the demultiplexing circuit in the second direction can be reduced. This helps increase the length of the L-cut formed in the driving bonding area, which is beneficial to improve a bending performance of the driving bonding area ABC, and is conducive to the reduction of the overall size and the improvement of its portability.

BRIEF DESCRIPTION OF DRAWINGS

Description of Drawings

In order to illustrate the technical solutions more clearly in the embodiments of the present application, the following will briefly introduce the drawings that need to be used in the description of the embodiments. Obviously, the drawings in the following description are only some embodiments of the present application. For those skilled in the art, without creative work, other drawings can be obtained based on these drawings.

Figure 1:
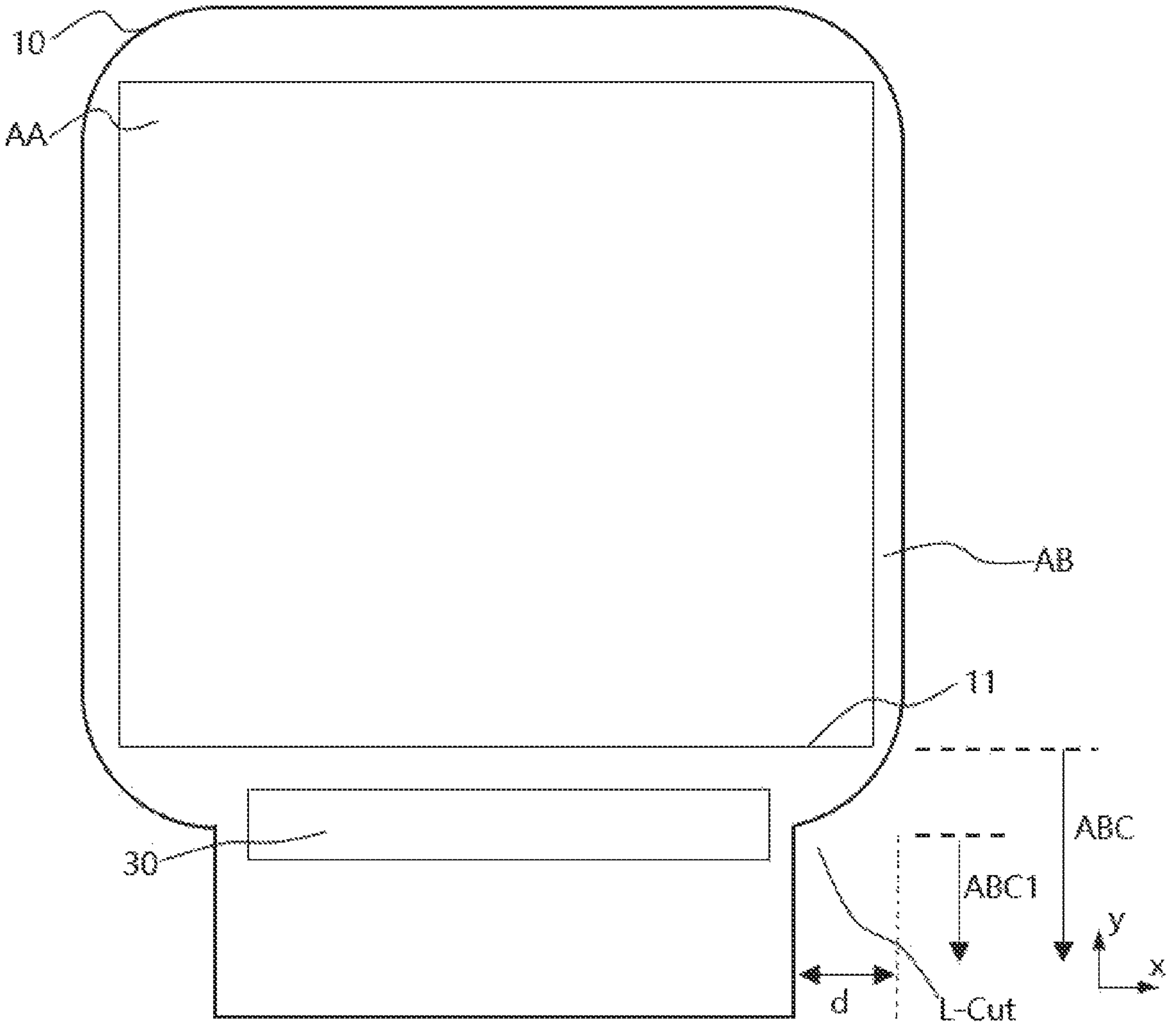

FIG. 1 is a schematic diagram of a display panel in the prior art.

Figure 2:
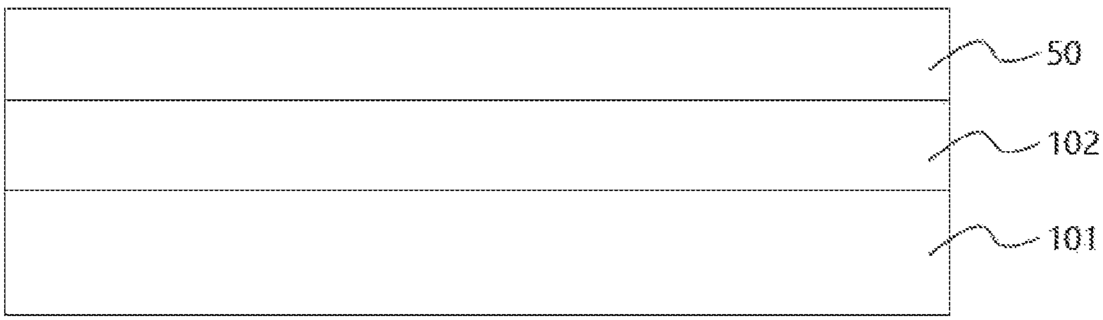

FIG. 2 is a schematic cross-sectional structure diagram of a display panel provided by an embodiment of the present application.

Figure 3:
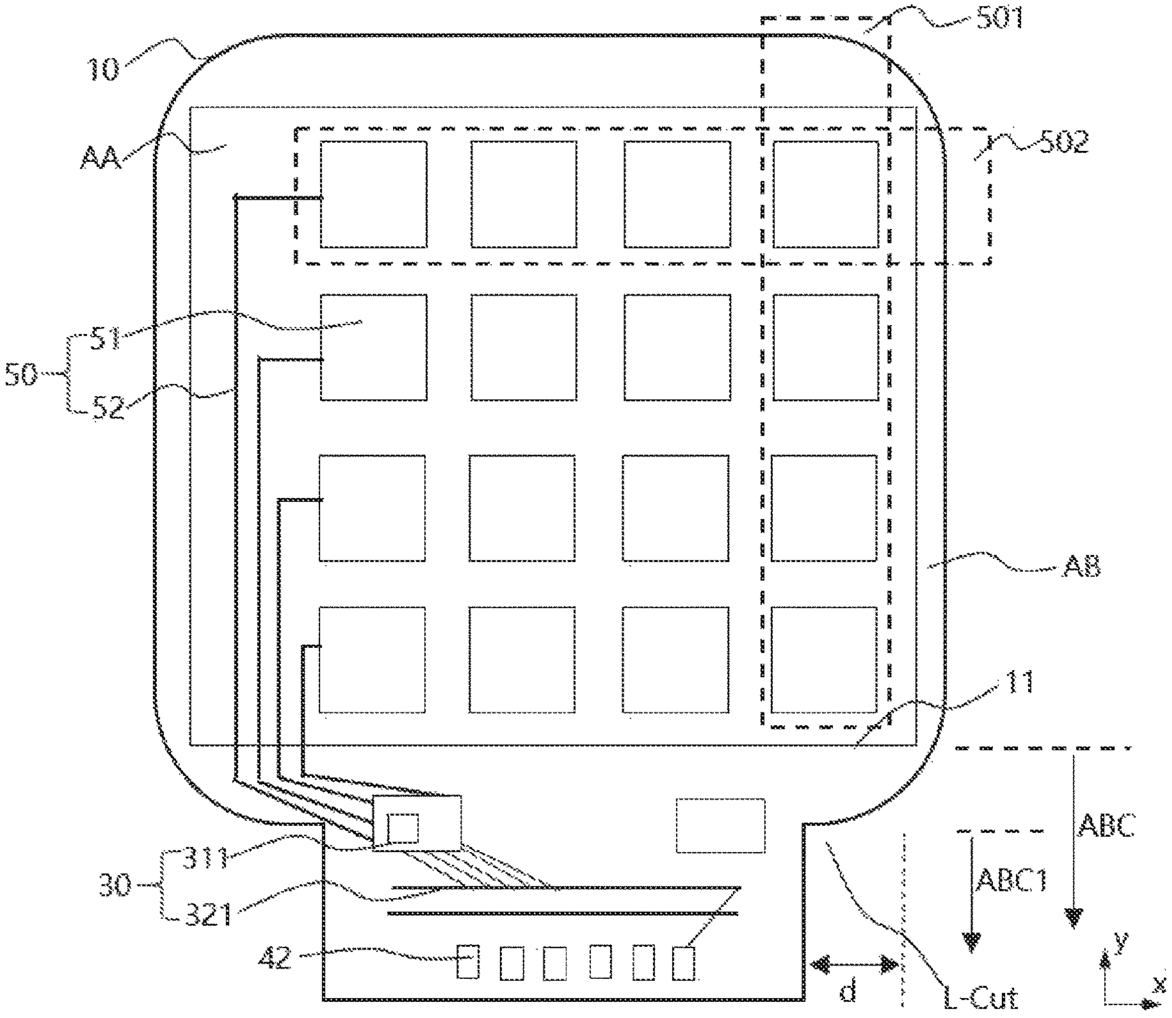

FIG. 3 is a first schematic top view of a display panel provided by an embodiment of the present application.

Figure 4:
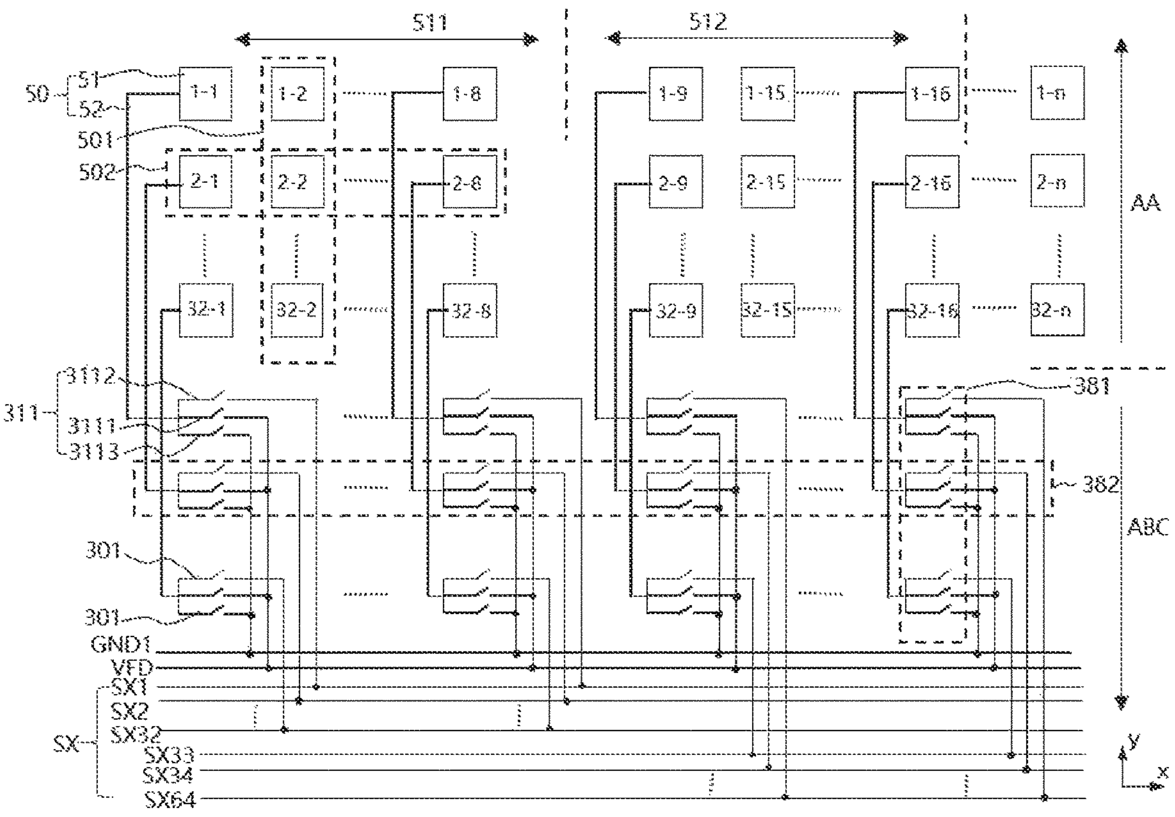

FIG. 4 is a first partial enlarged schematic diagram of a display panel provided by an embodiment of the present application.

Figure 5:
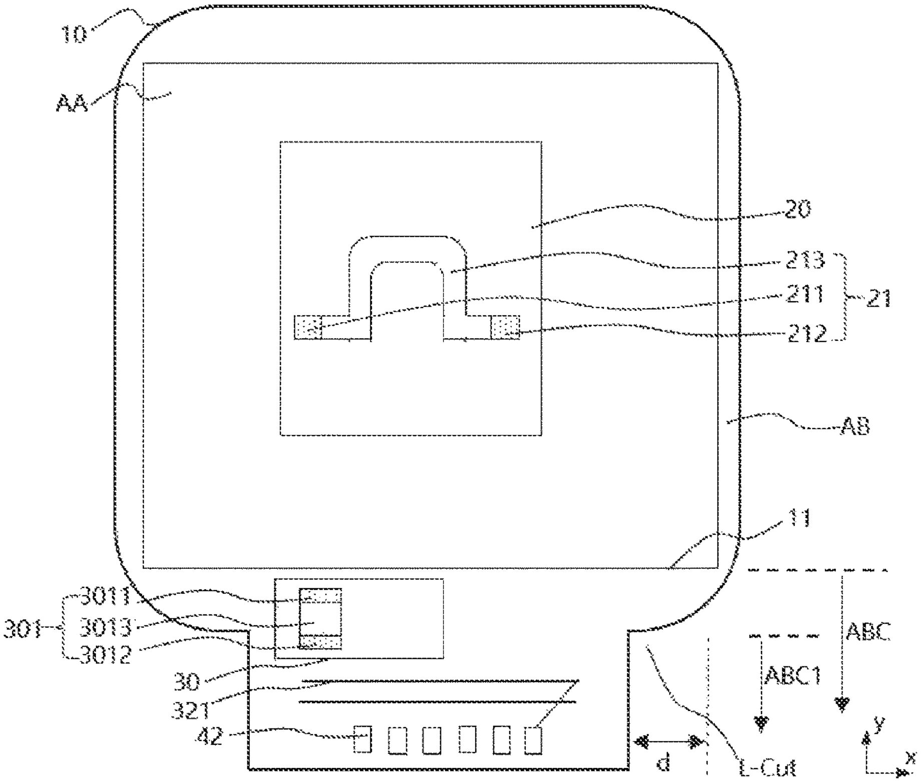

FIG. 5 is a second partial enlarged schematic diagram of a display panel provided by an embodiment of the present application.

EXAMPLES

Detailed Description of Preferred Embodiments

The technical solutions in the embodiments of the present application will be clearly and completely described below in conjunction with the drawings in the embodiments of the present application. Obviously, the described embodiments are only a part of the embodiments of the present application, rather than all the embodiments. Based on the embodiments in this application, all other embodiments obtained by those skilled in the art without creative work shall fall within the protection scope of this application. In addition, it should be understood that the specific implementations described here are only used to illustrate and explain the application and are not used to limit the application. In this application, if no explanation is made to the contrary, the orientation words used such as “upper” and “lower” generally refer to the upper and lower directions of the device in actual use or working state, and specifically refer to the drawing directions in the drawings. “Inner” and “outer” refer to the outline of the device.

An embodiment of the present application provides a display panel including a display area and a non-display area located on a side of the display area, wherein the display panel includes a substrate; a touch layer disposed on a side of the substrate, wherein the touch layer comprises touch electrodes arranged in the display area and arranged along the first direction and the second direction and touch wires disposed corresponding to the touch electrodes, and the first direction is different from the second direction; a demultiplexing circuit group disposed on a side of the substrate and located in the non-display area, wherein the demultiplexing circuit group comprises demultiplexing circuits corresponding to the touch electrodes, and each of the demultiplexing circuits is electrically connected to a corresponding touch electrode through the touch wires; wherein the demultiplexing circuits are arranged along the first direction and the second direction in the non-display area, and in the first direction, the demultiplexing circuits corresponding to the touch electrodes in a same column are arranged in a same column.

The embodiment of the present application provides a display panel. Each embodiment will be described in detail below. It should be noted that the order of description in the following embodiments is not meant to limit the preferred order of the embodiments.

First Embodiment

Please refer to FIG. 2, FIG. 3, and FIG. 4. FIG. 2 is a schematic cross-sectional structure diagram of a display panel provided by an embodiment of the present application. FIG. 3 is a first schematic top view of a display panel provided by an embodiment of the present application. FIG. 4 is a first partial enlarged schematic diagram of a display panel provided by an embodiment of the present application. In order to facilitate the description and display of the solutions of the embodiments of the present application, FIG. 2, FIG. 3, and FIG. 4 show simplified parts of the structure as required. Part of the structure is shown in detail, and part of the structure is shown as examples.

The embodiment of the present application provides a display panel 10. The display panel 10 includes a display area AA and a non-display area AB located on one side of the display area AA. The display panel 10 includes a substrate 101, a touch layer 50, and a demultiplexing circuit group 30. The touch layer 50 is disposed on one side of the substrate 101. The touch layer 50 includes touch electrodes 51 arranged in the display area AA and arranged along a first direction y and a second direction x and touch wires 52 arranged corresponding to the touch electrodes 51. The first direction y is different from the second direction x. The demultiplexing circuit group 30 is disposed on one side of the substrate 101 and located in the non-display area AB. The demultiplexing circuit group 30 includes a demultiplexing circuit 311 corresponding to each touch electrode 51. Each demultiplexing circuit 311 is electrically connected to the corresponding touch electrode 51 through a touch wire 52. The plurality of demultiplexing circuits 311 are arranged along the first direction y and the second direction x in the non-display area. In the first direction y, the demultiplexing circuits 311 corresponding to the touch electrodes 51 in the same column are arranged in the same column.

Specifically, the display panel 10 includes a display area AA and a non-display area AB. The non-display area includes a driving bonding area ABC. The driving bonding area ABC is located on one side of the display area AA.

Specifically, the display panel 10 includes a substrate 101, a touch layer 50, and a demultiplexing circuit group 30. The substrate 101 may be a base of an array substrate. The display panel 10 may include structures such as thin film transistors, scan lines, and data lines. The display panel 10 may also include structures such as a light emitting layer and an encapsulation layer. The structure of the display panel 10 is not limited here, and the structure of the display panel 10 is not described in detail here.

Specifically, the touch layer 50 and the demultiplexing circuit group 30 are disposed on one side of the substrate 101. Generally, the touch layer 50 and the demultiplexing circuit group 30 are arranged on the same side of the substrate 101.

Specifically, the touch layer 50 includes touch electrodes 51 arranged in the display area AA and arranged along the first direction y and the second direction x and touch wires 52 arranged corresponding to the touch electrodes 51. The first direction y is different from the second direction x.

Specifically, the demultiplexing circuit group 30 is provided on one side of the substrate 101 and located in the non-display area AB. More specifically, the demultiplexing circuit group 30 is located in the driving bonding area ABC of the display panel 10.

Specifically, the demultiplexing circuit group 30 includes a demultiplexing circuit 311 corresponding to each touch electrode. Each demultiplexing circuit 311 is electrically connected to the corresponding touch electrode 51 through a touch wire 52. That is, one touch electrode corresponds to one demultiplexing circuit 311.

Specifically, the multiple demultiplexing circuits 311 are arranged along the first direction y and the second direction x in the non-display area. In the first direction y, the demultiplexing circuits 311 corresponding to the touch electrodes 51 in the same column are arranged in the same column.

Specifically, the plurality of touch electrodes 51 are arranged in a plurality of touch electrode columns 501 along the first direction y. The plurality of touch electrodes 51 are arranged in a plurality of touch electrode rows 502 along the second direction x.

Specifically, the multiple demultiplexing circuits 311 are arranged into multiple demultiplexing circuit columns 381 along the first direction y. The plurality of demultiplexing circuits 311 are arranged in a plurality of demultiplexing circuit rows 382 along the second direction x.

Specifically, the demultiplexing circuits 311 corresponding to the touch electrodes 51 in the same column are arranged in the same column. For example, the touch electrode column 501 in the first column corresponds to the demultiplexing circuit column 381 in the first column. For example, the touch electrode column 501 in the second column corresponds to the demultiplexing circuit column 381 in the second column. For example, the touch electrode column 501 in the third column corresponds to the demultiplexing circuit column 381 in the third column, which is not repeated here.

Further, more specifically, the demultiplexing circuits 311 corresponding to the touch electrodes 51 in the same row are arranged in the same row. For example, the touch electrode row 502 of the first row corresponds to the demultiplexing circuit row 382 of the first row. For example, the touch electrode row 502 in the second row corresponds to the demultiplexing circuit row 382 in the second row. For example, the touch electrode row 502 in the third row corresponds to the demultiplexing circuit row 382 in the third row, which will not be repeated here.

In some embodiments, the display panel 10 further includes a plurality of touch binding terminals 42 arranged on the non-display AB. Each touch binding terminal 42 is electrically connected to the input ends of a plurality of demultiplexing circuits 311 that multiplex the same signal channel.

In this embodiment, a display panel is provided. A plurality of demultiplexing circuits 311 are arranged along the first direction y and the second direction x in the non-display area AB. In the first direction y, the demultiplexing circuits 311 corresponding to the touch electrodes 51 in the same column are arranged in the same column. The multiple demultiplexing circuits 311 in the demultiplexing circuit group 30 are arranged in the non-display area AB according to the multiple touch electrodes 51 along the first direction y and the second direction x. Therefore, the length of the demultiplexing circuit 311 in the second direction y can be reduced. This helps to increase the length d of the L-cut formed in the driving bonding area ABC. This is conducive to improving the bending performance of the driving bonding area ABC, and is conducive to the reduction of the whole machine volume and the improvement of its portability.

Second Embodiment

This embodiment is the same as or similar to the foregoing embodiment, except that the structure of the display panel 10 is further limited.

Please refer to FIG. 5, which is a second partial enlarged schematic diagram of a display panel provided by an embodiment of the application. In order to facilitate the description and display of the solutions of the embodiments of the present application. FIG. 5 simplifies part of the structure as needed. Part of the structure is shown in detail, and part of the structure is shown as examples.

In some embodiments, the demultiplexing circuit 311 includes a plurality of first transistors 301. The plurality of first transistors 301 in each demultiplexing circuit 311 are arranged along the first direction y.

In some embodiments, the channel of the first transistor 301 extends along the first direction y.

Specifically, a semiconductor layer of the first transistor 301 includes a first source terminal 3011, a first drain terminal 3012, and a first channel 3013 provided between the first source terminal 3011 and the first drain terminal 3012. The first source terminal 3011 and the first drain terminal 3012 of the first transistor 301 are arranged along the first direction y.

Specifically, the first direction y is perpendicular to an edge 11 where the driving bonding area ABC and the display area AA intersect.

Specifically, the first direction intersects the second direction x. Preferably, the first direction y is perpendicular to the second direction x.

Specifically, as shown in FIG. 4, the demultiplexing circuit 311 includes a plurality of first transistors 301. The plurality of first transistors 301 are arranged along the first direction y. Further, the plurality of first transistors 301 in the demultiplexing circuit 311 occupy a relatively small length in the second direction x. Thus, the length of the demultiplexing circuit 311 in the second direction x is further reduced. This helps to increase the length d of the L-cut formed in the driving bonding area ABC. This is conducive to improving the bending performance of the driving bonding area ABC, and is conducive to the reduction of the whole machine volume and the improvement of its portability.

In some embodiments, the display panel 10 further includes a driving circuit layer 102. The driving circuit layer 102 is disposed between the substrate 101 and the touch layer 50. The driving circuit layer 102 includes a plurality of driving circuits 20 arranged along the first direction y and the second direction x. The driving circuit 20 includes a second transistor 21. A channel extension direction of the second transistor 21 is different from a channel extension direction of the first transistor 301.

In some embodiments, the channel of the second transistor 21 extends along the second direction x.

Specifically, as shown in FIG. 2, the display panel 10 further includes a driving circuit layer 102. The driving circuit layer 102 may include structures such as thin film transistors, scan lines, and data lines.

Specifically, when the display panel 10 is an organic light-emitting display panel, the driving circuit 20 may be a pixel driving circuit, and the second transistor 21 may be a driving transistor of the pixel driving circuit. For example, the 7T1C driving circuit 20 includes a second transistor 21 and six switching transistors.

Specifically, it is easily understood by those skilled in the art that the semiconductor layer of the second transistor 21 of the driving circuit 20 usually has a shape such as a "几" shape or an "S" shape. As shown in FIG. 5, it is illustrated that the semiconductor layer of the second transistor 21 is in the shape of a "几". The semiconductor layer of the second transistor 21 includes a second source terminal 211, a second drain terminal 212, and a second channel 213 provided between the second source terminal 211 and the second drain terminal 212. The second source terminal 211 and the second drain terminal 212 of the second transistor 21 are arranged along the second direction x.

Specifically, it is easy for those skilled in the art to understand that in order to ensure characteristics of the second transistor 21, an amorphous silicon needs to undergo an excimer laser annealing process (ELA) to form polysilicon. A direction of an excimer laser annealing process is along the second direction x. The second direction x is parallel to the edge 11 where the driving bonding area ABC and the display area AA intersect.

In this embodiment, a display panel is provided. The demultiplexing circuit 311 includes a plurality of first transistors 301. The plurality of first transistors 301 are arranged along the first direction y. The plurality of first transistors 301 in the demultiplexing circuit 311 occupy a relatively small length in the second direction x. Thus, the length of the demultiplexing circuit 311 in the second direction x is further reduced. This helps to increase the length d of the L-cut formed in the driving bonding area ABC. This is conducive to improving the bending performance of the driving bonding area ABC, and is conducive to the reduction of the whole machine volume and the improvement of its portability.

In this embodiment, the driving circuit 20 includes a second transistor 21. The channel extension direction of the second transistor 21 is different from the channel extension direction of the first transistor 301. Further, the channel of the second transistor 21 extends along the second direction x. This can ensure the characteristics of the second transistor 21 and improve the driving performance of the driving circuit 20. In addition, this can help increase the length d of the L-cut formed in the driving bonding area ABC. This is conducive to improving the bending performance of the driving bonding area ABC, and is conducive to the reduction of the whole machine volume and the improvement of its portability.

Third Embodiment

This embodiment is the same as or similar to the foregoing embodiment, except that the structure of the display panel 10 is further limited.

In some embodiments, the plurality of first transistors 301 of each demultiplexing circuit 311 include at least a first driving transistor 3111, a first sensing transistor 3112, and a first reset transistor 3113. The first driving transistor 3111, the first sensing transistor 3112, and the first reset transistor 3113 are arranged along the first direction y. The demultiplexing circuit group 30 also includes a plurality of driving wires 321. The plurality of driving wires 321 includes at least one driving signal providing wire VFD, a plurality of sensing signal receiving wires SX, and at least one reset signal providing wire GND1. The driving signal supply wire VFD is electrically connected to the corresponding touch electrode 51 through the corresponding first driving transistor 3111. The sensing signal receiving wire SX is electrically connected to the corresponding touch electrode 51 through the corresponding first sensing transistor 3112. The reset signal supply wire GND1 is electrically connected to the corresponding touch electrode 51 through the corresponding first reset transistor 3113.

Specifically, the plurality of first transistors 301 of each demultiplexing circuit 311 may include a first driving transistor 3111 and a first sensing transistor 3112. The plurality of first transistors 301 of each demultiplexing circuit 311 may further include a first reset transistor 3113.

Specifically, the first driving transistor 3111, the first sensing transistor 3112, and the first reset transistor 3113 are arranged along the first direction y. The plurality of first transistors 301 in the demultiplexing circuit 311 occupy a relatively small length in the second direction x. Thus, the length of the demultiplexing circuit 311 in the second direction x is further reduced. This helps to increase the length d of the L-cut formed in the driving bonding area ABC. This is conducive to improving the bending performance of the driving bonding area ABC, and is conducive to the reduction of the whole machine volume and the improvement of its portability.

Specifically, the driving signal providing wire VFD provides a touch driving signal to the touch electrode 51 through the first driving transistor 3111. The sensing signal receiving wire SX receives the touch signal of the finger sensed by the touch electrode 51 through the first sensing transistor 3112. The reset signal supply wire GND1 provides a reset signal to the touch electrode 51 through the first reset transistor 3113.

In some embodiments, the multiple touch electrodes 51 are arranged into multiple touch electrode columns 501 and multiple touch electrode rows 502. The touch layer 50 includes at least a first touch layer group 511 and a second touch layer group 512. Each of the first touch layer group 511 and the second touch layer group 512 includes at least two columns of touch electrode columns 501. The touch electrodes 51 of each row in the first touch layer group 511 are electrically connected to the same sensing signal receiving wire SX through the demultiplexing circuit 311 of the corresponding row. The touch electrodes 51 of each column in the first touch layer group 511 are electrically connected to different sensing signal receiving wires SX through the demultiplexing circuit 311 of the corresponding column. The touch electrodes 51 of each row in the second touch layer group 512 are electrically connected to the same sensing signal receiving wire SX through the demultiplexing circuit 311 of the corresponding row. The touch electrodes 51 of each column in the second touch layer group 512 are electrically connected to different sensing signal receiving wires SX through the demultiplexing circuit 311 of the corresponding column. The sensing signal receiving wire SX electrically connected to the first touch layer group 511 is different from the sensing signal receiving wire SX electrically connected to the second touch layer group 512.

Specifically, as shown in FIG. 4, the touch layer 50 of the display panel 10 at least includes a first touch layer group 511 and a second touch layer group 512. Each of the first touch layer group 511 and the second touch layer group 512 includes at least two columns of touch electrode columns 501.

Specifically, the touch layer 50 may include multiple touch layer groups. For example, the touch layer 50 includes a first touch layer group 511, a second touch layer group 512, a third touch layer group, and so on.

Specifically, the first touch layer group 511 and the second touch layer group 512 each include at least two columns of touch electrode columns 501. For example, the first touch layer group 511 and the second touch layer group 512 each include three and two rows of touch electrode rows 501, which are not limited here.

Specifically, the touch electrodes 51 of each row in the first touch layer group 511 are electrically connected to the same sensing signal receiving wire SX. The touch electrodes 51 of different rows in the first touch layer group 511 are electrically connected to different sensing signal receiving wires SX. This can reduce the number of sensing signal receiving wires SX in the first touch layer group 511. Compared with the second touch layer group 512, this can realize that the touch electrodes 51 in the first touch layer group 511 independently receive finger touch information and feedback the finger touch information to a touch chip.

Specifically, the touch electrodes 51 of each row in the second touch layer group 512 are electrically connected to the same sensing signal receiving wire SX. The touch electrodes 51 of different rows in the second touch layer group 512 are electrically connected to different sensing signal receiving wires SX. This can reduce the number of sensing signal receiving wires SX in the second touch layer group 512. Compared with the first touch layer group 511, this enables the touch electrodes 51 in the second touch layer group 512 to independently receive finger touch information and feedback the finger touch information to the touch chip.

Specifically, the sensing signal receiving wire SX electrically connected to the first touch layer group 511 is different from the sensing signal receiving wire SX electrically connected to the second touch layer group 512. This can make the first touch layer group 511 and the second touch layer group 512 independent and non-interfering when receiving finger touch information.

Specifically, by reducing the number of sensing signal receiving wires SX in the first touch layer group 511 and reducing the number of sensing signal receiving wires SX in the second touch layer group 512, a border width of the non-display area AB or the driving bonding area ABC can be reduced.

In some embodiments, the multiple touch electrodes 51 in the first touch layer group 511 are electrically connected to the same driving signal to provide a wire VFD through the demultiplexing circuit 311 in the corresponding row. The multiple touch electrodes 51 in the second touch layer group 512 are electrically connected to the same driving signal to provide a wire VFD through the demultiplexing circuit 311 of the corresponding row.

In some embodiments, the multiple touch electrodes 51 in the first touch layer group 511 are electrically connected to the same reset signal providing wire GND1 through the demultiplexing circuit 311 in the corresponding row. The multiple touch electrodes 51 in the second touch layer group 512 are electrically connected to the same reset signal providing wire GND1 through the demultiplexing circuit 311 of the corresponding row.

In some embodiments, the first touch layer group 511 and the second touch layer group 512 are electrically connected to the same driving signal providing wire VFD and the same reset signal providing wire GND1.

Specifically, by reducing the number of driving signal providing wire VFD, and/or by reducing the number of reset signal providing wire GND1, a frame width of the non-display area AB or the driving bonding area ABC can be reduced.

Fourth Embodiment

This embodiment is the same as or similar to the third embodiment, and the difference lies in that the characteristics of the display panel 10 during touch operation are further limited.

In some embodiments, when the display panel 10 is performing a touch operation, the first sensing transistor 3112 corresponding to the touch electrode 51 of a column of touch electrode columns 501 in the first touch layer group 511 and the first sensing transistors 3112 corresponding to the touch electrodes 51 of a column of touch electrode columns 501 in the second touch layer group 512 are turned on at the same time.

Specifically, the touch operation of each touch electrode 51 includes at least a touch signal providing phase and a touch signal receiving phase. In the touch signal providing stage, the corresponding touch electrode 51 is provided with a touch driving signal. In the touch signal receiving stage, the sensing signal fed back by the touch electrode 51 is received.

Specifically, the first sensing transistor 3112 corresponding to the touch electrode 51 of a column of touch electrode columns 501 in the first touch layer group 511 and the first sensing transistors 3112 corresponding to the touch electrodes 51 of a column of touch electrode columns 501 in the second touch layer group 512 are turned on at the same time. That is, a column of touch electrode columns 501 in the first touch layer group 511 and a column of touch electrode columns 501 in the second touch layer group 512 are in the touch signal receiving stage at the same time.

In this embodiment, the first sensing transistor 3112 corresponding to the touch electrode 51 of a column of touch electrode columns 501 in the first touch layer group 511 and the first sensing transistors 3112 corresponding to the touch electrodes 51 of a column of touch electrode columns 501 in the second touch layer group 512 are turned on at the same time. This can reduce time for the entire touch layer 50 to complete a complete touch task, or can reduce the time for the entire touch layer 50 to complete a cycle touch task. Thereby, the frequency of the touch operation can be increased, and the touch accuracy and other touch performance of the display panel 10 can be improved.

Fifth Embodiment

This embodiment is the same as or similar to the fourth embodiment, and the difference is that a touch driving method of the display panel 10 is provided.

It should be noted that please refer to FIG. 3 and FIG. 4, FIG. 3 illustrates plurality of touch electrode columns 501 and plurality of touch electrode rows 502, and FIG. 4 illustrates a plurality of demultiplexing circuit columns 381 and a plurality of demultiplexing circuit rows 382. 1-1 in the figure represents touch electrodes 51 in the first row of touch electrode rows and the first column of touch electrode columns. 1-2 in the figure shows the touch electrodes 51 of the touch electrode row in the first row and the touch electrode column in the second column. 1-8 in the figure indicate touch electrodes 51 of the first row of touch electrode rows and the eighth column of touch electrode columns. 1-9 in the figure indicate touch electrodes 51 of the first row of touch electrode rows and the ninth column of touch electrode columns. 1-16 in the figure indicate touch electrodes 51 in the first row of touch electrode rows and the 16th column of touch electrode columns. **1-*n* in the figure represents the touch electrodes 51 of the touch electrode row in the first row and the touch electrode column in the nth column. 2-1 in the figure shows the touch electrodes 51 of the second row of touch electrode rows and the first column of touch electrode columns. 2-2 in the figure represents the touch electrodes 51 of the second row of touch electrode rows and the second column of touch electrode columns. 2-8 in the figure indicate the touch electrodes 51 of the second row of touch electrode rows and the eighth column of touch electrode columns. 2-9 in the figure indicate touch electrodes 51 of the second row of touch electrode rows and the ninth column of touch electrode columns. 2-16 in the figure indicate touch electrodes 51 of the second row of touch electrode rows and the 16th column of touch electrode columns. 2-*n* in the figure represents the touch electrodes 51 of the touch electrode row in the second row and the touch electrode column in the nth column. 32-1 in the figure denotes touch electrodes 51 in the 32nd row of touch electrodes and the first column of touch electrodes 51. 32-2 in the figure represents the touch electrodes 51 of the touch electrode row in the 32nd row and the touch electrode column in the second column. 32-8 in the figure indicate touch electrodes 51 in the 32nd row of touch electrode rows and the 8th column of touch electrode columns. 32-9 in the figure indicate touch electrodes 51 in the 32nd row of touch electrode rows and the 9th column of touch electrode columns. 32-16 in the figure indicate touch electrodes 51 in the 32nd row of touch electrode rows and the 16th column of touch electrode columns. In the figure, 32-*n* denotes the touch electrode 51** of the touch electrode row of the 32nd row and the touch electrode column of the nth column.

It should be noted that, please refer to FIG. 3 and FIG. 4, FIG. 4 exemplifies that the touch layer includes 32 rows and n columns of touch electrodes 51, but it is not limited to this. For example, the touch layer 50 may include touch electrodes 51 in 32 rows and 16 columns. The touch layer 50 may include m rows and 16 columns of touch electrodes 51. The touch layer 50 may include m rows and n columns of touch electrodes 51, and m and n are integers.

It should be noted that please refer to FIG. 3 and FIG. 4, and FIG. 4 illustrates an implementation situation as an example. The touch electrodes 51 of 1-1 to the touch electrodes 51 of 32-16 are electrically connected to the same driving signal providing wire VFD. The touch electrodes 51 of 1-1 to the touch electrodes 51 of 32-16 are electrically connected to the same reset signal providing wire GND1.

It should be noted that please refer to FIG. 3 and FIG. 4, and FIG. 4 illustrates an implementation situation as an example. The touch electrodes 51 of 1-1 to 1-8 in the first touch layer group 511 (the touch electrodes 51 in the touch electrode row 502 of the first row of the first touch layer group 511) are electrically connected to the first sensing signal receiving wire SX1. The touch electrodes 51 of 2-1 to 2-8 in the first touch layer group 511 (the touch electrodes 51 in the second touch electrode row 502 of the first touch layer group 511) are electrically connected to the second sensing signal receiving wire SX2. The touch electrodes 51 of 32-1 to 32-8 in the first touch layer group 511 (the touch electrodes 51 in the touch electrode row 502 of the 32nd row of the first touch layer group 511) are electrically connected to the 32nd sensing signal receiving wire SX32. The sensing signal receiving wires SX of the electrical connections of the touch electrodes 51 in the touch electrode rows 502 of the other rows of the first touch layer group 511 can be deduced by analogy, which will not be repeated here.

It should be noted that please refer to FIG. 3 and FIG. 4, and FIG. 4 illustrates an implementation situation as an example. The touch electrodes 51 from 1-9 to 1-16 in the second touch layer group 512 (the touch electrodes 51 in the first touch electrode row 502 of the second touch layer group 512) are electrically connected to the 33rd sensing signal receiving wire SX33. The touch electrodes 51 from 2-9 to 2-16 in the second touch layer group 512 (the touch electrodes 51 in the second touch electrode row 502 of the second touch layer group 512) are electrically connected to the 34th sensing signal receiving wire SX34. The touch electrodes 51 from 32-9 to 32-16 in the second touch layer group 512 (the touch electrodes 51 in the touch electrode row 502 of the 32nd row of the second touch layer group 512) are electrically connected to the 64th sensing signal receiving wire SX64. The sensing signal receiving wires SX electrically connected to the touch electrodes 51 in the touch electrode rows 502 of the other rows of the second touch layer group 512 can be deduced by analogy, which will not be repeated here.

This embodiment provides a touch driving method for the display panel 10. The display panel 10 of any one of the above embodiments adopts this touch driving method. The plurality of touch electrodes 51 are arranged in an array of n columns of touch electrode columns 501, where n is a positive integer. The number of touch electrode columns 501 in the first touch layer group 511 is the same as the number of touch electrode columns 501 in the second touch layer group 512. The touch driving method includes a column of touch electrode columns 501 in the first touch layer group 511 and a column of touch electrode columns 501 in the second touch layer group 512 performing at least part of the same touch stage work at the same time.

In the embodiment of the present application, by arranging a column of touch electrode columns 511 in the first touch layer group 511 and a column of touch electrode columns 501 in the second touch layer group 512 to perform at least part of the same touch stage work at the same time. This can reduce the time for the entire touch layer 50 to complete a complete touch task, or can reduce the time for the entire touch layer 50 to complete a cycle touch task. Thereby, the frequency of the touch operation can be increased, and the touch accuracy and other touch performance of the display panel 10 can be improved.

In some embodiments, the touch operation of each touch electrode 51 includes at least a touch signal providing phase and a touch signal receiving phase. In the touch signal providing stage, the corresponding touch electrode is provided with a touch driving signal. In the touch signal receiving stage, the sensing signal fed back by the touch electrode is received. The same touch stage includes at least a touch signal receiving stage.

Specifically, in the touch signal providing stage, the driving signal providing wire VFD is provided to the corresponding touch electrode 51 to touch the driving signal. In the touch signal receiving stage, the sensing signal fed back by the touch electrode 51 is received through the sensing signal receiving wire SX. The specific feedback is the touch signal of the finger.

In the embodiments of this application, please refer to the fourth embodiment, in some embodiments, the sensing signal receiving wire SX electrically connected to the first touch layer group 511 is different from the sensing signal receiving wire SX electrically connected to the second touch layer group 512. Therefore, a column of touch electrode columns 581 in the first touch layer group 511 and a column of touch electrode columns 581 in the second touch layer group 512 simultaneously perform the work of the touch signal receiving stage. The sensing signal receiving wire SX electrically connected to the first touch layer group 511 and the sensor signal receiving wire SX electrically connected to the second touch layer group 512 are different. Therefore, the touch signal fed back by the first touch layer group 511 and the touch signal fed back by the second touch layer group 512 do not interfere with each other so as to achieve precise touch. In addition, the time for the entire touch layer 50 to complete a complete touch task can be reduced, or the time for the entire touch layer 50 to complete a cycle touch task can be reduced. Thereby, the frequency of the touch operation can be increased, and the touch accuracy and other touch performance of the display panel 10 can be improved.

In some embodiments, the touch driving method includes that the first touch electrode column of the first touch layer group 511 (touch electrodes 51 from 1-1 to 32-1) to the last touch electrode column of the first touch layer group 511 (touch electrodes 51 from 1-8 to 32-8) are sequentially driven. The last touch electrode column of the second touch layer group 512 (touch electrodes 51 from 1-16 to 32-16) to the first touch electrode column of the second touch layer group 512 (touch electrodes 51 from 1-9 to 32-9) are sequentially driven.

In some embodiments, the touch driving method includes that the last touch electrode column of the first touch layer group 511 (touch electrodes 51 from 1-8 to 32-8) to the first touch electrode column of the first touch layer group 511 (touch electrodes 51 from 1-1 to 32-1) are sequentially driven. The first touch electrode column of the second touch layer group 512 (touch electrodes 51 from 1-9 to 32-9) to the last touch electrode column of the second touch layer group 512 (touch electrodes 51 from 1-16 to 32-16) are sequentially driven.

In the embodiment of the present application, a specific driving sequence of the two touch electrode columns 501 in the first touch layer group 511 and the second touch layer group 512 is provided. This can reduce the time for the entire touch layer 50 to complete a complete touch task, or can reduce the time for the entire touch layer 50 to complete a cycle touch task. Thereby, the frequency of the touch operation can be increased, and the touch accuracy and other touch performance of the display panel 10 can be improved.

It should be noted that the touch layer 50 may include multiple touch layer groups. For example, the touch layer 50 includes a first touch layer group 511, a second touch layer group 512, and a third touch layer group. The touch driving method of the display panel includes a column of touch electrode columns in each of the plurality of touch layer groups to perform at least part of the same touch stage work at the same time. According to the above detailed description of this embodiment, those skilled in the art can easily understand the touch driving method of multiple touch layer groups, which will not be repeated here.

The above has described in detail a display panel provided by the embodiment of the present application. Specific examples are used in this article to illustrate the principle and implementation of this application. The description of the above embodiments is only used to help understand the method and core idea of the present application. In addition, for those skilled in the art, based on the idea of the present application, there will be changes in the specific implementation and the scope of application. In summary, the content of this specification should not be construed as a limitation to this application.

What is claimed is:

1. A display panel comprising a display area and a non-display area located on a side of the display area, wherein the display panel comprises:

a substrate;

a touch layer disposed on a side of the substrate, wherein the touch layer comprises touch electrodes arranged in the display area and arranged along a first direction and a second direction and touch wires disposed corresponding to the touch electrodes, the first direction is a column direction of the touch electrodes, and the second direction is a row direction of the touch electrodes; and a demultiplexing circuit group disposed on a side of the substrate and located in the non-display area, wherein the demultiplexing circuit group comprises demultiplexing circuits corresponding to the touch electrodes, and each of the demultiplexing circuits is electrically connected to a corresponding touch electrode through the touch wires;

wherein the demultiplexing circuits are arranged along the first direction and the second direction in the non-display area, and some of the demultiplexing circuits that are connected to corresponding ones of the touch electrodes in a same column are also arranged in a same column and are aligned with each other;

wherein each demultiplexing circuit comprises a plurality of first transistors, and the plurality of first transistors within each demultiplexing circuit are arranged in alignment along the first direction;

wherein the plurality of first transistors of each demultiplexing circuit comprise a first driving transistor, a first sensing transistor, and a first reset transistor; the first driving transistor, the first sensing transistor, and the first reset transistor are arranged along the first direction and aligned with each other; the first driving transistor, the first sensing transistor, and the first reset transistor, as a group of first transistors corresponding to each demultiplexing circuit, are connected to a respective one of the touch electrodes through the touch wires; and wherein the demultiplexing circuit group further comprises a plurality of driving wires, the plurality of driving wires comprise at least one driving signal providing wire, a plurality of sensing signal receiving wires, and at least one reset signal providing wire, the driving signal providing wire is electrically connected to a corresponding touch electrode through a corresponding first driving transistor, each sensing signal receiving wire is electrically connected to a corresponding touch electrode through a corresponding first sensing transistor, and the reset signal providing wire is electrically connected to a corresponding touch electrode through a corresponding first reset transistor.

2. The display panel according to claim 1, wherein the display panel further comprises a plurality of non-display touch bonding terminals, and each of the touch bonding terminals is electrically connected to an input terminal of the demultiplexing circuits that multiplex a same signal channel.

3. The display panel according to claim 1, wherein the display panel further comprises:

a driving circuit layer disposed between the substrate and the touch layer, wherein the driving circuit layer comprises a plurality of driving circuits arranged along the first direction and the second direction, and each driving circuit comprises a second transistor;

wherein a channel extension direction of the second transistor is different from a channel extension direction of the first transistor.

4. The display panel according to claim 3, wherein a channel of the first transistor extends along the first direction.

5. The display panel according to claim 4, wherein a channel of the second transistor extends along the second direction.

6. The display panel according to claim 1, wherein:

the plurality of touch electrodes comprise a plurality of touch electrode columns arranged along the first direction and a plurality of touch electrode rows arranged along the second direction, the touch layer comprises at least a first touch layer group and a second touch layer group, the first touch layer group and the second touch layer group both comprise at least two columns of touch electrode columns;

wherein the touch electrodes of each row in the first touch layer group are electrically connected to the same sensing signal receiving wire through the demultiplexing circuits of a corresponding row, the touch electrodes in each column of the first touch layer group are electrically connected to different sensing signal receiving wires through the demultiplexing circuits of a corresponding column;

wherein the touch electrodes of each row in the second touch layer group are electrically connected to the same sensing signal receiving wire through the demultiplexing circuits of a corresponding row, the touch electrodes in each column of the second touch layer group are electrically connected to different sensing signal receiving wires through the demultiplexing circuits of a corresponding column, and the sensing signal receiving wire electrically connected to the first touch layer group is different from the sensing signal receiving wire electrically connected to the second touch layer group.

7. The display panel according to claim 6, wherein a plurality of the touch electrodes in the first touch layer group are electrically connected to the same driving signal providing wire through the demultiplexing circuits in a corresponding row;

the plurality of touch electrodes in the second touch control layer group are electrically connected to the same driving signal providing wire through the demultiplexing circuits in a corresponding row.

8. The display panel according to claim 7, wherein:

the plurality of the touch electrodes in the first touch layer group are electrically connected to the same reset signal providing wire through the demultiplexing circuits in a corresponding row;

the plurality of touch electrodes in the second touch layer group are electrically connected to the same reset signal providing wire through the demultiplexing circuits in a corresponding row.

9. The display panel according to claim 8, wherein the first touch layer group and the second touch layer group are electrically connected to the same driving signal providing wire and the same reset signal providing wire.

10. The display panel according to claim 6, wherein when the display panel performs a touch operation, the first sensing transistors corresponding to the touch electrodes of a column of the touch electrode columns in the first touch layer group and the first sensing transistors corresponding to the touch electrodes of a column of the touch electrode columns in the second touch layer group are turned on at the same time.

* * * * *